United States Patent [19]

Feldman

[11] Patent Number: 5,424,549
[45] Date of Patent: Jun. 13, 1995

[54] SCANNING SYSTEMS FOR HIGH RESOLUTION E-BEAM AND X-RAY LITHOGRAPHY

[75] Inventor: Martin Feldman, Baton Rouge, La.

[73] Assignee: Board of Supervisors of Louisiana State University and Agricultural and Mechanical College, Baton Rouge, La.

[21] Appl. No.: 136,300

[22] Filed: Oct. 14, 1993

Related U.S. Application Data

[62] Division of Ser. No. 811,305, Dec. 20, 1991, Pat. No. 5,263,073.

[51] Int. Cl.⁶ .......................................... H01J 37/317
[52] U.S. Cl. ........................... 250/492.22; 250/398; 250/492.24
[58] Field of Search ............... 250/492.22, 398, 492.24

[56] References Cited

U.S. PATENT DOCUMENTS

| | | | |
|---|---|---|---|
| 4,695,732 | 9/1987 | Ward | 250/492.2 |
| 4,705,956 | 11/1987 | Ward | 250/492.2 |
| 4,742,234 | 5/1988 | Feldman et al. | 250/492.2 |
| 4,891,830 | 1/1990 | Iwahashi | 378/35 |
| 4,924,257 | 5/1990 | Jain | 355/53 |
| 4,939,373 | 7/1990 | Elliston et al. | 250/492.3 |
| 4,945,551 | 7/1990 | Makabe et al. | 378/34 |
| 4,947,413 | 8/1990 | Jewell et al. | 378/34 |
| 5,023,462 | 6/1991 | Yamada et al. | 250/492.24 |
| 5,115,456 | 5/1992 | Kimura et al. | 378/35 |

OTHER PUBLICATIONS

Vladimirsky et al., "High-Resolution Fresnel Zone Plates for Soft X-rays," J. Vac. Sci. Technol. B, vol. 6, No. 1, pp. 311–315 (1988).

Ward et al., "A 1:1 Electron Stepper," J. Vac. Sci. Technol. B, vol. 4, No. 1, pp. 89–93 (1986).

H. Kinoshita et al., "Soft X-ray Reduction Lithography Using Multilayer Mirrors," J. Vac. Sci. Technol. B, vol. 7, No. 6, pp. 1648–1651 (1989).

*Primary Examiner*—Paul M. Dzierzynski
*Assistant Examiner*—Kiet T. Nguyen
*Attorney, Agent, or Firm*—John H. Runnels

[57] ABSTRACT

An electron-beam lithography apparatus and method, including an electron source with a mask or photocathode for generating a patterned electron beam; an electron-sensitive resist layer; a conductive plate with a slit, located between the electron source and the resist layer, with the patterned electron beam passing only through the slit; an electric field between the electron source and the conductive plate to accelerate electrons, with the conductive plate causing the electric field between the plate and the resist to be substantially zero; a magnetic field between the electron source and the resist, to focus electrons on the resist; and alignment device for synchronously scanning the mask or photocathode and the resist at the same velocity relative to the slit and to the electron source, and at zero velocity relative to each other, so that substantially all of the pattern of the patterned electron beam is imaged on the resist without substantial change in size.

4 Claims, 9 Drawing Sheets

SCANNING SYSTEMS FOR HIGH RESOLUTION E-BEAM AND X-RAY LITHOGRAPHY

This is a divisional of application Ser. No. 07/811,305, filed Dec. 20, 1991, now U.S. Pat. No. 5,263,073, the entire disclosure of which is incorporated by reference.

This invention pertains to high resolution lithography systems, particularly to scanning systems for X-ray and e-beam lithography, with either 1:1 imaging or n:1 reduction imaging.

The linewidth of circuit elements in integrated circuits has decreased considerably in recent years with improvements in optical lithography techniques. It is expected that optical methods will soon reach their resolution limit. To produce even smaller linewidths will require other techniques, such as X-ray lithography or electron-beam ("e-beam") lithography.

Although optical lithography is capable of patterning integrated circuits below 0.5 microns, it is clear that the wavelength of the illumination will eventually limit the resolution of the images. It is likely that X-ray lithography will become the method of choice when minimum feature sizes approach 0.1 micron, although e-beam lithography is a technique which should not be overlooked.

Proximity printing as used in conventional X-ray lithography is limited by two effects:

1) It is difficult to maintain the extremely small gaps between mask and wafer (about 5 microns) needed for high resolution; and
2) It is difficult to manufacture, test, and repair the high resolution, high aspect ratio, low distortion masks needed by this 1:1 printing system.

Projection X-ray lithography addresses the first of these issues and, when combined with image reduction, the second as well. However, while projection X-ray lithography has been demonstrated in principle, the technical requirements for useful versions of the proposed systems are beyond the present state of the art.

(1) 1:1 Imaging with X-Rays. Fresnel zone plates for focusing X-rays are known in the art, as are methods for their fabrication. See, e.g., Vladimirsky et al., "High-Resolution Fresnel Zone Plates for Soft X-rays," J. Vac. Sci. Technol. B, Vol. 6, No. 1 (1988), the entire disclosure of which is incorporated by reference. Zone plates have severe chromatic aberration, in that their focal length is approximately proportional to the reciprocal of the wavelength. In addition, highly monochromatic X-ray sources are both weak and expensive. Consequently the use of a zone plate is effectively limited to a very small field. Therefore, the use of an array of zone plates has typically been proposed, as illustrated in FIG. 1. Because of image inversion by each zone plate 2, the boundaries of adjacent fields in the mask 4 do not align properly in the image 6, as illustrated by arrows 8 and 10. A past solution has been to use a second army of zone plates 12 for a second inversion, as illustrated in FIG. 2. Virtual imaging from the zone plates, and "crosstalk" between fields then results in unwanted background exposure. These effects may be reduced by limiting the field of each zone plate, spacing the zone plates relatively far apart, and using a third array of zone plates 14 as field lenses. The field lens zone plates direct the light from the first army 2 so that it passes more nearly through the center of the second army 12. Stops 16 might also be used. Each of these strategies has the disadvantages of reducing the throughput of the system, and of increasing its complexity.

(2) Reduction Imaging with X-Rays. Reduction imaging with X-rays may be performed with Fresnel zone plate arrays, or with reflecting optical systems such as Schwarzschild lenses. Schwarzschild lenses have small usable fields, and are difficult and costly to manufacture. See H. Kinoshita et al., "Soft X-ray Reduction Lithography Using Multilayer Mirrors," J. Vac. Sci. Tech., Vol. B7, No. 6, pp. 1648-1651 (1989). Other proposed mirror systems would have larger fields, but would require very large components manufactured to accuracies that are currently unattainable in practice.

(3) 1:1 Imaging with an e-beam. Prior approaches to e-beam lithography have included (a) modulated scanning electron beam and aperture imaging direct write systems, which are inherently slow, and Co) 1:1 imaging systems, illustrated in FIG. 3, using parallel magnetic and electric fields between a mask 20 and a wafer 22. The latter approach has the disadvantages: (1) that if the wafer is not totally flat (e.g., if it has previously been printed), the electric field will be distorted near the wafer, causing a loss in resolution and/or local distortion; (2) that electrons hitting the wafer cause secondary electrons to scatter with a range of energies, after which the secondary electrons also hit the wafer, causing background exposure and a loss of resolution; (3) that it is difficult to create a magnetic field of sufficient uniformity (to the ppm level) over the volume needed; and (4) that no correction can be made for local wafer distortion.

As illustrated in FIG. 4, problems (1) and (2) above, but not problems (3) and (4), have previously been reduced through the use of a conductive grid 24 with many apertures, giving a zero electric field in the region between the grid 24 and the wafer 22. The grid is typically located at or near a first focus of the electrons. The grid must be moved during exposure to prevent the shadow of the grid from being imaged on the wafer. This approach does not use scanning, and has the disadvantages (a) of needing a relatively hard-to-produce, highly-uniform magnetic field over the large region between the mask and the grid, and (b) of not correcting local distortions. See, e.g., Ward et al., "A 1:1 Electron Stepper," J. Vac. Sci. Technol. B, Vol. 4, No. 1 (1986); Ward, U.S. Pat. Nos. 4,705,956 and 4,695,732; and Elliston, U.S. Pat. No. 4,939,373.

Feldman et al., U.S. Pat. No. 4,742,234 discloses apparatus for direct-write lithography with a charged particle beam, incorporating an electric field, a magnetic field, and a conductive plate having an elongated slit. Imaging from a mask is not discussed, the data being directly entered from a computer.

In a "step-and-scan" system, different parts of the same circuit are imaged in different scans. Alignment, or overlay accuracy, on the boundaries between adjacent areas must be very precise; misalignment can be a source of circuit failure, because the effects of distortion are "concentrated" at these boundaries.

Novel systems have been developed in the present invention for high-resolution lithography using either e-beams or X-rays. These systems variously permit either 1:1 imaging (i.e., imaging without reduction), or n:1 reduction imaging.

(1) 1:1 imaging with X-rays is performed with two arrays of zone plates, with the mask at the focal plane of the first array. It is advantageous also to place plates with small apertures near one or both points of focus to block most virtual imaging and crosstalk. The aperture area is about 1% of the total plate area. The mask and wafer are locked together and scanned. Because the mask is at the focus of the first array, only one point is imaged by each zone plate at a given time (within the resolution of the optics). Because only points are imaged, no image inversion occurs. The zone plates are arranged in two-dimensional arrays such that after completion of scanning, every point on the mask is imaged to a corresponding point on the wafer.

This 1:1 imaging system uses two zone plate arrays, two aperture plates, and a parallel beam of substantially monochromatic X-rays, such as may be generated by an undulator in a synchrotron. Because the zone plate arrays may be densely packed, relatively few X-rays are "lost" in interstices between plates, and the throughput is high. As with other zone plate systems, the focal length is selected to be relatively short, so that images over a reasonable spread of wavelengths remain within the depth of focus.

To print a field on a wafer with the 1:1 X-ray projection system, the mask and wafer are first brought into registration with each other. They are then simultaneously scanned, while the X-ray beam and the zone plate arrays remain fixed. Alternatively, the X-ray beam and the zone plate arrays may be scanned with the mask and wafer fixed.

The scan is similar to that used in conventional X-ray proximity printing on a storage ring beam line. The principal difference is that the zone plate arrays are positioned near the mask during the scan. In addition, the limited bandwidth and diffraction efficiency of the zone plates suggest that an undulator beam should better match the system requirements than would a bending magnet beam.

(2) Reduction imaging with X-rays requires multiple scans, with accurate tracking of the mask and wafer positions. Mechanical tolerances are tight. However, they do not approach the tolerances of other proposed reduction projection X-ray systems based on multilayer coatings.

Reduction (n:1) imaging with X-rays may be performed by replacing the 1:1 imaging zone plates in FIG. 5 with n:1 imaging zone plates. The ratio of the mask scanning speed to the wafer scanning speed would be n. In addition, multiple scans from different parts of the mask would be required to completely cover the wafer with image points.

Reduction (n:1) imaging with X-rays may also be performed with a line of reducing zone plates. The mask and wafer are scanned in opposite directions, each perpendicular to a line through the centers of the zone plates, and at a ratio of speeds equal to the reduction ratio n. The resulting image strips on the wafer will be smaller than those on the mask by a factor of n, and will be spaced farther apart by a factor of n relative to the strip separation on the mask. The mask and wafer are then stepped to fill in interleaving strips, etc., until the entire image is formed. A fixed aperture plate is advantageously added above the wafer to reduce background from virtual imaging.

Because the images on the wafer will be inverted and separated relative to those on the mask, the layout on the mask will differ from that on the wafer. Thus "stitching" of adjacent areas will be needed, even if this system is used for 1:1 imaging, i.e., without reduction.

Alignments must have close tolerances, but this mechanical problem is no greater than is the case with other systems. This novel system has the following advantages: (1) the X-ray optics are simple; (2) reduction of the mask also reduces errors in the mask (or in the stage); (3) a relatively small number of passes is required to expose the entire field, a number depending on the degree of reduction; and (4) the incident X-ray beam need not be as highly collimated. Generation of a zone plate array is within the current state of the art. X-ray projection lenses, by contrast, are beyond the current state of the art, or at least are very expensive. Furthermore, the throughput with an available X-ray projection lens would be slow, because a large number of passes would be needed due to the small field of view such a lens has. The present invention requires only a few passes to expose the entire field.

Furthermore, the use of phase zone plates to increase zone plate efficiency is well known. Such zone plates may be made for X-ray lithography with thicknesses on the order of one micron of aluminum or silicon. In addition, blazed phase zone plates can be used to increase efficiency further, while simultaneously reducing the power of virtual images. See Leger, Holz, Swanson, and Veldkamp, Lincoln Lab Journal, Vol. 1, pp. 225 et seq. (1988), the entire disclosure of which is incorporated by reference.

The zone plate imaging systems of this invention are capable of a very flat field, and can have more than 4 microns depth of focus. The condensing and imaging zone plate arrays are essentially X-ray masks with relatively small fields, and can be made by conventional processing techniques. If they are distortion free, or at least matched to each other, then the imaging with a collimated X-ray beam is also distortion free. In addition, the on-axis imaging systems are telecentric. These optical properties are important to the lithography, and are difficult to achieve using conventional X-ray projection systems.

An operating wavelength near 10 Å is preferred for X-ray lithography based on considerations of resist characteristics and circuit damage. However, the techniques of this invention may be readily scaled and applied to other wavelengths. In contrast, multilayer projection systems appear to be constrained to longer wavelengths.

Both the 1:1 and the n:1 reduction systems use conventional X-ray masks. Masks for an n:1 reduction system are easier to make, because the minimum feature size is correspondingly larger. However, the pattern is more complex than the image on the wafer.

The techniques of this invention are capable of diffraction-limited projection X-ray lithography, with resolutions well below 0.1 micron. The mechanical requirements to maintain registration over the full scan are important, especially in the case of reduction imaging. However, they present no fundamental limitations, and in fact are similar to those of existing optical scanning systems. The system is based on existing X-ray mask technology, and all of the elements used have previously been demonstrated separately.

(3) 1:1 imaging with e-beams is accomplished by focusing the beam with magnetic and electric fields, and passing the beam through a single narrow slit in a plate of conductive material. The conductive plate produces a zero electric field between the plate and the wafer, greatly reducing problems from scattered secondary electrons.

The mask and wafer are locked together and scanned, the apparatus is then stepped to image another strip, etc.

Because the electron beam passes only through a narrow slit, only a relatively small region of the magnetic field must have high uniformity. In addition, small corrections based on local alignments may adjust the mask-to-wafer registration, and introduce small gradients in the magnetic field to correct for local distortions.

ZONE PLATES

The resolution R of a zone plate is given by $$R = \frac{\lambda}{2NA} \quad [1]$$

where $\lambda$ is the wavelength of the exposing light, and NA is the numerical aperture. For zone plates used at a large reduction ratio, R is also the approximate width of the narrowest, outer ring. Using zone plates patterned by e-beam lithography, resolutions well below 0.1 micron are routinely obtained. For example, X-ray microscopes based on zone plates are a well-established technology.

To obtain the high flux needed for practical lithographic applications, the zone plate must function over a band of wavelengths, $\Delta\lambda$. Using a band of wavelengths introduces chromatic aberration, however, because the focal length of a zone plate is proportional to $1/\lambda$. We have $$\frac{\Delta\lambda}{\lambda} = -\frac{\Delta f}{f} \quad [2]$$

$\Delta f$ should not exceed the depth of focus, D, given by $$D = \frac{\lambda}{2(NA)^2} \leq |\Delta f| \quad [3]$$

which leads to $$f \leq \frac{\lambda}{\Delta\lambda} \frac{2R^2}{\lambda} \quad [4]$$

For example, with a 1% bandwidth X-ray beam centered at 10 Å and R=0.1 micron, we have $$f \leq 2 \text{ mm}, NA \approx 0.005 \quad [5]$$

which implies a maximum zone plate diameter of about 20 microns. It is apparent that even with a scanning system it is impractical to image a large field with such a small zone plate. However, many zone plates can be combined into an array to produce a useful imaging system. For efficient utilization of the X-ray beam, it is desirable that the array fully cover the projected area of the X-ray beam. See FIGS. 6 and 7. Complete patterning of the wafer surface is obtained by scanning, just as in proximity printing with an electron storage ring beam.

I. 1:1 X-RAY IMAGING

The image formed by a lens or zone plate is inverted through the axis of the lens or zone plate. In scanning systems generally, the mask and wafer move in opposite directions so that conjugate points remain conjugate over the entire field of the lens. For 1:1 imaging, it is mechanically desirable to lock the mask to the wafer during scanning. In single lens scanning systems, folding mirrors may be used to obtain this result.

Figure 1:
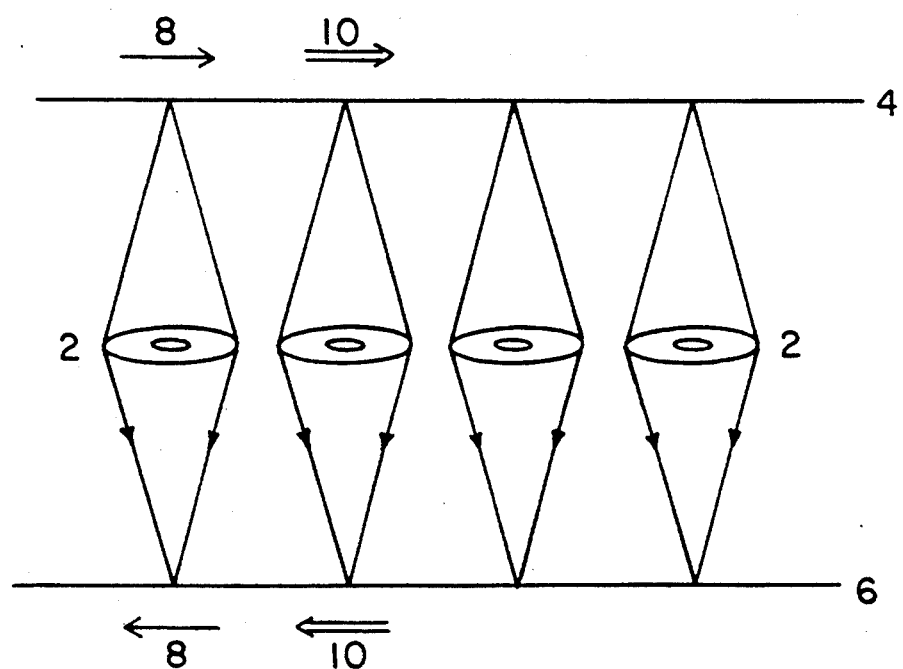
FIG. 1 illustrates a proposed array of zone plates for 1:1 imaging with X-rays, which is not in accordance with the present invention.
Figure 2:
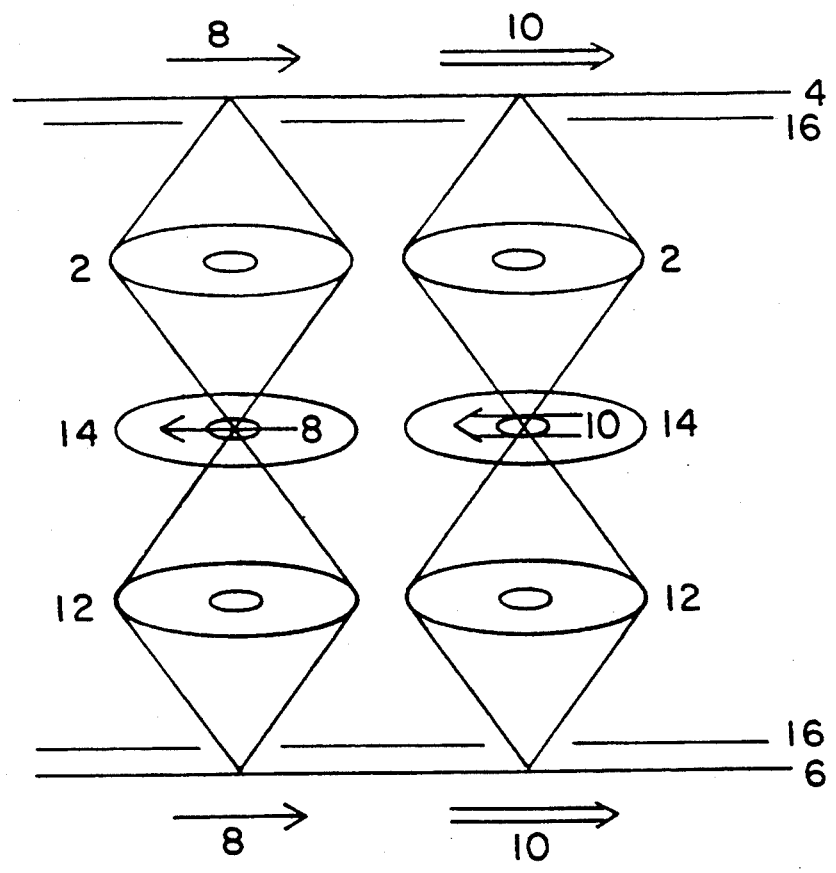
FIG. 2 illustrates another proposed arrangement of zone plate arrays for 1:1 imaging with X-rays, which is not in accordance with the present invention.
Figure 3:
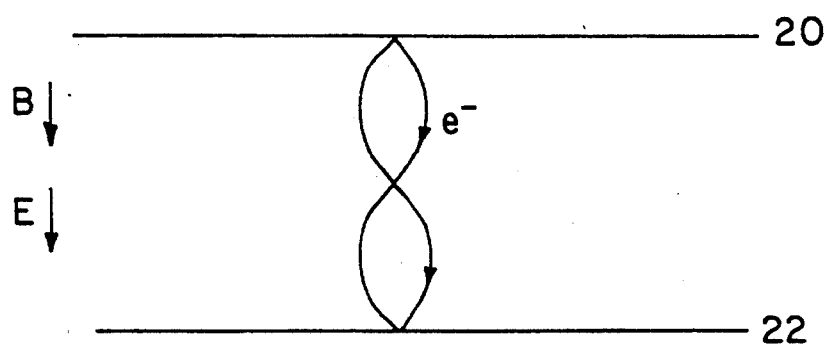
FIGS. 3 and 4 illustrate prior methods of imaging with an e-beam.
Figure 4:
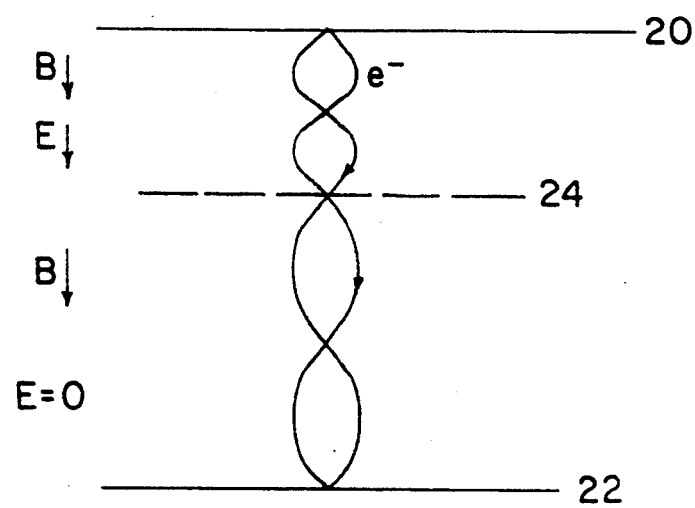

The inverted images formed by adjacent zone plates in a two dimensional array bring together images of portions of the mask which were previously well separated, as illustrated in FIG. 1. This effect precludes replication of the mask by scantling unless one of two strategies is followed:

1) A second army of zone plates is used to invert the image again, so that a noninverted final image is formed, as illustrated in FIG. 2. This approach probably requires a third array of zone plate field lenses 14, as well as various stops to minimize cross talk, and would be relatively complex. It is not discussed further here.

Figure 5:
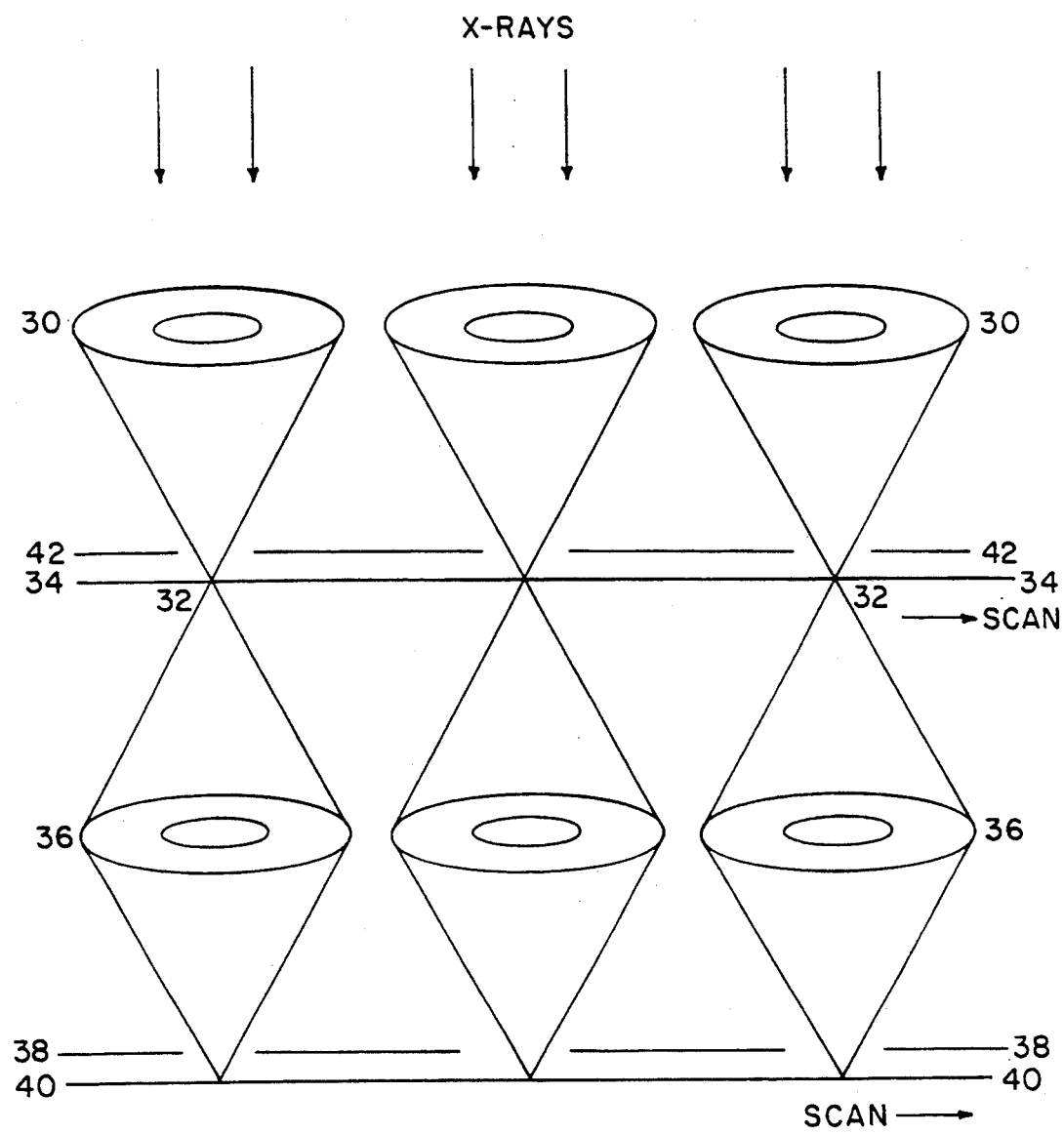
FIG. 5 illustrates an arrangement of zone plate arrays for 1:1 imaging with X-rays in accordance with the present invention.

2) As illustrated in FIG. 5, the field of each zone plate 30 is restricted to a single point 32 on mask 34 on axis. This result may be achieved with a corresponding array of zone plate condensing lenses and a collimated X-ray beam. An array of stops 38 near the wafer 40 minimizes cross talk and light from virtual images. This approach has the major advantage that mask 34 and wafer 40 can be mechanically locked together and scanned. For this reason it is the preferred method for 1:1 replication. An optional array of stops 42 near the mask can also reduce cross talk.

Each condensing zone plate 30 and its corresponding imaging zone plate 36 form a simple imaging system. The component values suggested in Table I easily satisfy equation [5], and are modest compared to those of zone plates that have been fabricated for use with X-ray microscopes. Zone plates for such applications are often free standing to avoid absorption of soft X-rays in the substrate; at 10 Å the zone plate arrays would use a thicker absorber on a substrate. They are, in fact, essentially X-ray masks. However, because the imaging zone plates are used at 1:1 replication, they should have a minimum feature size of about half that of the features to be printed.

TABLE I

| Design parameters for a 1:1 on-axis zone plate imaging system. | |
|---|---|
| Zone plate diameter | 10 μm |
| focal length of zone plate 30 | 1 mm |
| object distance of zone plate 36 | 1 mm |
| image distance of zone plate 36 | 1 mm |
| separation of stops 38 from the wafer 40 | 50 μm |

TABLE I-continued

Design parameters for a 1:1 on-axis zone plate imaging system.

| | |
|---|---|
| resolution | 0.1 μm |

Figure 6:
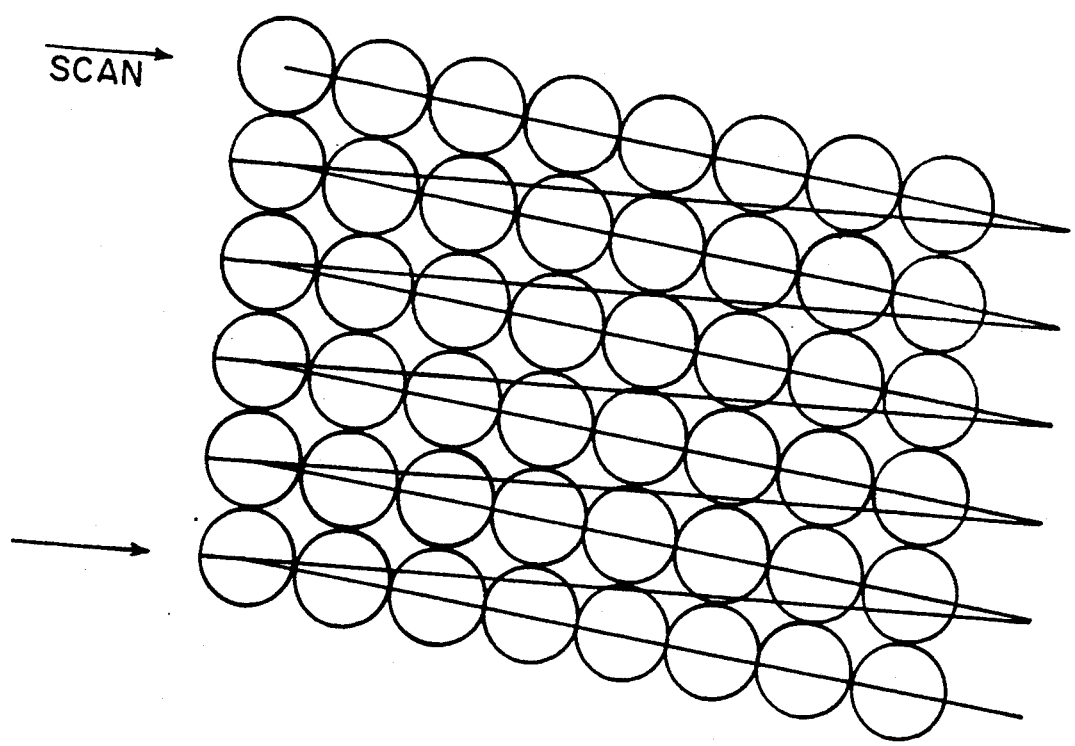
FIGS. 6 and 7 illustrate possible arrangements of zone plates and directions for scanning with an array of zone plates.
Figure 7:
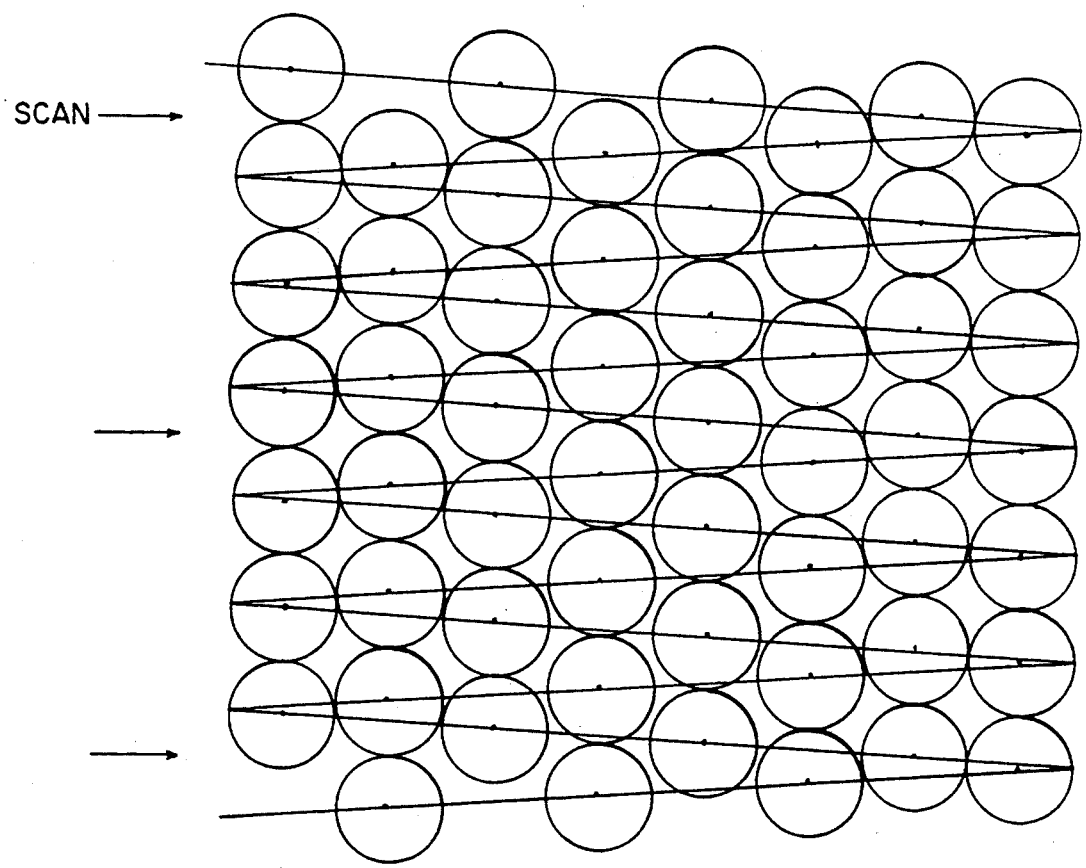

During exposure each imaging zone plate 36 scans a line on the mask 34 onto the wafer 40. An array of 100 columns of zone plates, with adjacent columns offset by 0.1 micron from each other, as illustrated in FIG. 6, uniformly covers the wafer with 100 scan lines in every 10 microns. While this approach is satisfactory, it requires critical control of the angle between the zone plate arrays and the direction of scanning. For example, the loss of entire scan lines could be caused by an error of only 0.1 mrad. A more satisfactory layout of the arrays is shown in FIG. 7. In this arrangement an error of 0.1 mrad modulates the average spacing between scan lines, resulting in an intensity variation of 1%, but with no gaps in the coverage.

From Equation [3] the depth of focus is 5 microns, which is reduced to about 4 microns by a 1% wavelength spread. Accurate spacing should be maintained both from the condensing zone plate to the mask, and from the mask to the wafer. However, the locations of the imaging zone plate and the stop are less critical.

The 1% bandwidth required for zone plate imaging may be obtained by filtering the spectrum of a conventional bending magnet X-ray lithography beam line. However, higher throughput should be possible by using the high brightness and narrow bandwidth of undulator beams.

UNDULATOR BEAMS

Undulator beams use a periodically varying magnetic field to concentrate synchrotron light into one (or several) narrow bands. A typical undulator beam at 10 Å with a 1% bandwidth has a diameter on the order of 1 mm, and a divergence of less than 0.1 mrad. Undulator beam techniques are described, for example, in H. Maezawa et al., Appl. Optics, Vol. 25, pp 3260 ff (1986), the entire disclosure of which is incorporated by reference. The beam can be shaped and collimated by means known in the art, so that there is a useable uniform rectangular cross section of dimensions w by h, where w is the width of the zone plate array and h is equal to both the height of the columns and the width of the field being scanned. The physical direction of scanning may either be vertical, as in conventional proximity printing, or horizontal, which has some mechanical advantages and is illustrated in FIGS. 6 and 7.

In the h direction a high degree of uniformity is desirable for uniform exposure of the wafer, just as in conventional proximity printing. If the w direction is wide enough, multiple groups of zone plates may be used, each of which completely scans the mask. This permits interlacing and exposure compensation, leading to improved resolution and greater latitude in beam uniformity in this direction.

High spectral purity of the undulator beam is desirable. For example, in FIG. 5 the third order harmonic which is diffracted by the condensing zone plate 30 and not by the imaging zone plate 36 is focused at the final image point. While this effect may be minimized by a stop 42 near the mask and/or a central obscuration of the imaging zone plate, spectral purity remains important.

Scanning techniques are known in the art, as disclosed for example in U.S. Pat. No. 3,819,265, the entire disclosure of which is incorporated by reference. Fabrication techniques for zone plates are also known in the art, as disclosed for example in Vladimirsky et al., cited above, the entire disclosure of which is incorporated by reference.

II. REDUCTION IMAGING WITH X-RAYS.

Single lens scanning reduction systems, which produce an inverted image, must scan the mask and wafer in opposite directions at velocities whose ratio is equal to the reduction ratio. The dynamic alignment required to maintain registration is technically difficult. However, an optical projection system utilizing this principle has been demonstrated and is commercially available. See J. D. Buckley, et al., J. Vac. Sci. Tech., Vol. B7, p. 1607 (1989), the entire disclosure of which is incorporated by reference.

Maintaining this ratio of scan velocities is necessary, but is not alone a sufficient condition for reduction printing with an array of imaging elements, because the fields on the mask are physically larger than the fields imaged on the wafer. But the fields on the mask cannot be larger than the separation between the imaging elements. Therefore, only a fraction of the wafer is exposed in a single scan. Subsequent scans, using different portions of the mask, are required to fill in the gaps. The mask pattern is not an enlarged version of the pattern printed on the wafer. The image is dissected, and it is precisely this dissection which permits the use of an array of imaging elements in the reduction system. See FIG. 8.

Methods of stepping and alignment are known in the art, and am shown for example in Buckley et al., cited above, and U.S. Pat. No. 4,924,257, the entire disclosures of both of which are incorporated by reference.

Two specific examples of this aspect of the invention are discussed below:

SINGLE POINT IMAGING

Arrays of condensing and imaging zone plates are used to form simple imaging systems similar to those used for 1:1 printing, as illustrated in FIG. 5. A 4:1 reduction ratio has been chosen for purposes of illustration, and the feature size on the mask is correspondingly 4 times as large as that on the wafer. Typical component values are listed in Table II. The imaging zone plate is easier to fabricate than for the 1:1 system, with a minimum linewidth of 0.08 microns for a final resolution of 0.1 microns.

TABLE II

Design parameters of a 4:1 on-axis zone plate reduction imaging system.

| | |
|---|---|
| Zone plate diameter | 10 μm |
| focal length of zone plate 30 | 4 mm |
| object distance of zone plate 36 | 4 mm |
| image distance of zone plate 36 | 1 mm |
| separation between stops 38 and the wafer 40 | 50 μm |
| spot size on mask | 0.4 μm |
| resolution | 0.1 μm |

The Zone Plates may be arrayed in either of the configurations shown for 1:1 imaging (see, e.g., FIGS. 6 and 7). However, adjacent columns are offset four times as much. Consequently, only every 4th line is printed on the wafer, even though these lines are adjacent to each other on the mask. The mask scans 4 times as fast as the wafer; depending on the direction of patterning it may be scanned either in the same direction or in the opposite direction. Subsequently, the same area of the wafer is rescanned three more times to fill in the missing scan lines. The same zone plate arrays, offset appropriately, may be used for the scan. However, entirely different portions of the mask, storing the information for the remaining portions of the pattern, are used. Accurate positioning of the components is critical to ensure that the interdigitated pattern is correctly reconstructed. Such accurate positioning may be readily accomplished with an interferometrically-controlled stage, as is commonly used in optical step-and-repeat systems known in the art.

STRIP IMAGING

Figure 8:
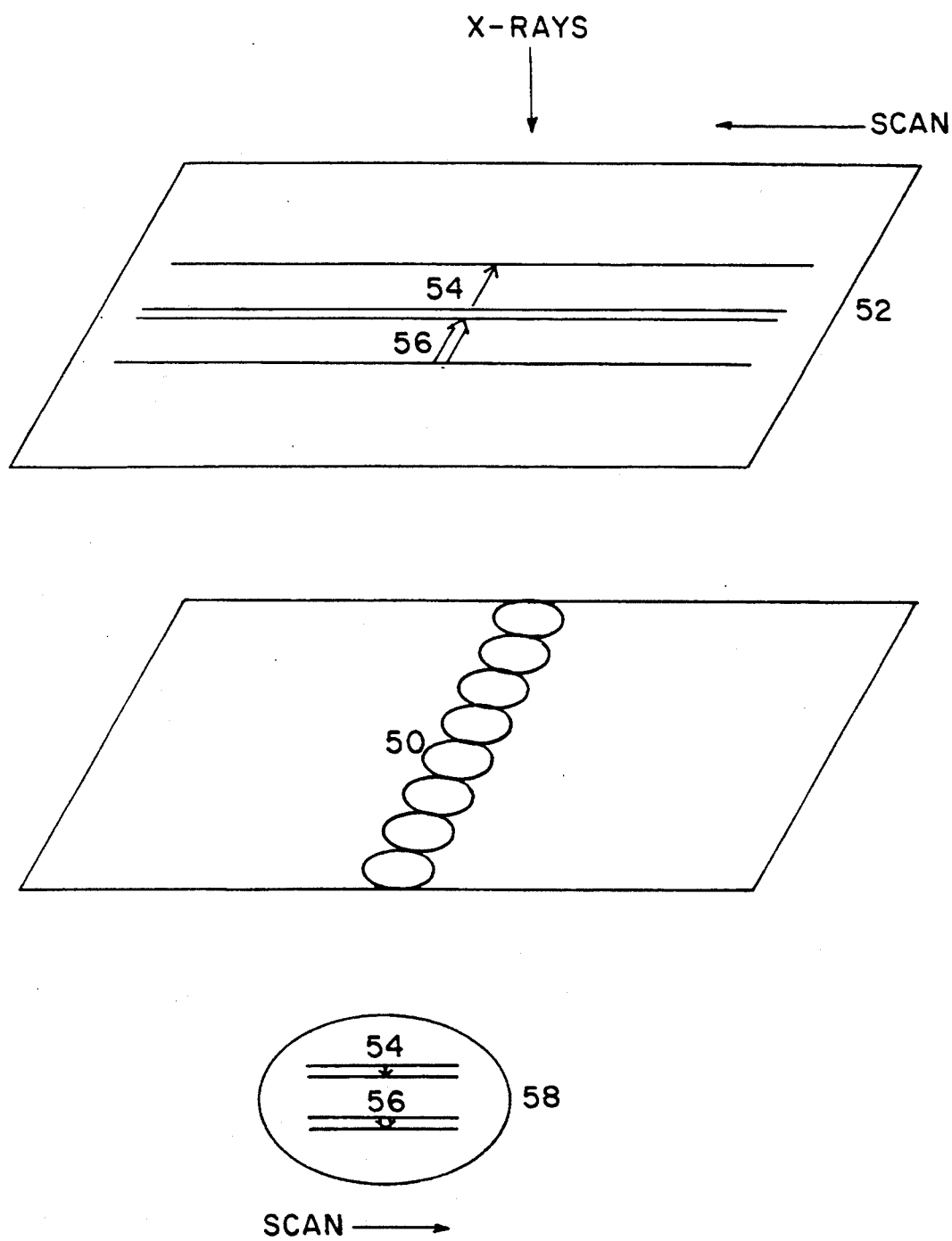
FIG. 8 illustrates an arrangement of zone plates for n:1 reduction imaging with X-rays in accordance with the present invention.

As illustrated in FIG. 8, reduction imaging may also be performed with a single column of zone plates 50, each of which images a field on the mask 52 slightly smaller than the zone plate diameter. After scanning, a strip 54 or 56 is printed on the wafer 58, with a strip width smaller by a factor equal to the reduction ratio. The mask and wafer scan in opposite directions.

An advantage of this technique is that the mask pattern may consist of strips 54 and 56 which are separated from one other, relaxing the alignment tolerance between the mask and the imaging system. In addition, the X-ray beam need not be accurately collimated. A disadvantage is that more scans need to be performed to cover the area on the mask between patterned strips such as 54 and 56.

Because the imaging array consists of only a single column of zone plates 50, the area of the incident X-ray beam that is used for exposure is only about 10 microns wide. To match an undulator beam to this width requires the beam optics to demagnify by a factor of about 100 in the w direction. Although this produces a corresponding increase in the beam divergence, and therefore in the size of the mask field in the h direction, the zone plate imaging remains diffraction limited. Table III summarizes suggested operating parameters.

TABLE III

Design parameters of a 4:1 strip imaging zone plate reduction system

| | |
|---|---|
| Zone plate diameter | 10 μm |
| focal length of zone plate 50 | 0.8 mm |
| object distance of zone plate 50 | 4 mm |
| image distance of zone plate 50 | 1 mm |
| separation of aperture plate from wafer | 50 μm |
| mask field | 8 μm × 40 μm |
| wafer field | 2 μm × 10 μm |

ZONE PLATE PERFORMANCE

The resolution of arrays of state of the art zone plates is more than adequate for 0.1 micron lithography. Larger single zone plates have been used in microscopes with resolutions on the order of 0.03 microns. The diffraction efficiency of "amplitude" zone plates, formed by patterning an absorber, is theoretically limited to about 10%, and values within a factor of two of this limit have been reported in X-ray microscopy. Because many of the systems of this invention require two arrays of zone plates, it is important that individual zone plate efficiencies be high. Fortunately, phase zone plates may be made with much higher efficiencies. At 10 Å the optimal thickness is approximately 1.6 microns of aluminum, or 1.7 microns of silicon, both of which lead to phase zone plates with theoretical efficiencies on the order of 30%.

One of the factors limiting zone plate efficiency is the formation of a virtual image with as much power as the real image. The primary purpose of the stops shown in FIG. 5 is to prevent unfocused light from these virtual images from exposing the resist. However, the technique of "binary imaging," in which the zone plates are stepped to approximate blazed gratings, can be used to enhance the real image at the expense of the virtual image. Such a technique is described, for example, in J. Leger, et al., Lin. Lab. J., Vol. 1, p. 225ff (1988), the entire disclosure of which is incorporated by reference. Such zone plates are more difficult to fabricate because each binary step adds extra processing and reduces the minimum feature width on the zone plate by a factor of two. Nevertheless, the advantages of improving the diffraction efficiency while simultaneously reducing the background illumination make this technique highly attractive for use in this invention.

III. 1:1 IMAGING WITH AN e-BEAM

Figure 9:
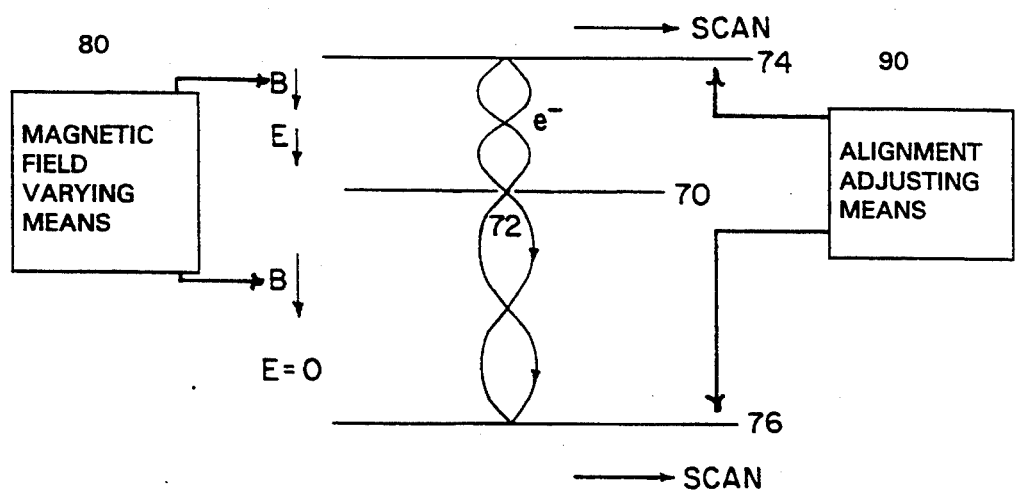
FIG. 9 illustrates a system for 1:1 imaging with an e-beam in accordance with the present invention.

A 1:1 e-beam imaging system is illustrated in FIG. 9. Plate 70 is electrically conductive and nonmagnetic. The bulk of plate 70 is relatively electron-impermeable. Slit 72 is relatively electron-permeable, and may be, but is not necessarily, a gap or void in plate 70. Plate 70 with slit 72 may be fabricated by means known in the art, and may include, for example: (1) a thin apertured copper sheet, (2) an apertured thin sheet of plastic coated with a conductive layer, (3) an apertured silicon wafer, (4) a glass channel plate, or (5) an apertured sheet of photo-etchable glass which is metallized on at least one surface. The relatively uniform electric and magnetic fields may be generated by means known in the art. In addition, magnetic field varying means 80 or alignment adjusting means 90 may optionally be used to correct for local magnetic field distortion, or to adjust the mask to the wafer registration, respectively.

The patterned electron beam from mask or source 74 is projected onto wafer 76 (which includes an electron-sensitive resist layer) to define a pattern. Because the velocity of electrons between slit 72 and wafer 76 is substantially equal to twice their average velocity between mask or source 74 and slit 72, the spacing of wafer 76 from slit 72 is preferably about twice the spacing of slit 72 from mask or source 74. Mask or source 74 and wafer 76 are locked together and scanned.

A "patterned electron beam," such as that emanating from mask or source 74, is one corresponding to the image desired on the wafer. There exist at least three different methods for generating such a patterned electron beam: (1) An external source (not shown) generates electrons, which pass through stench mask 74. (2) Source 74 is a photocathode. Electrons are emitted where light strikes the photocathode,, and light passing through a mask is imaged onto the photocathode. (3) Source 74 incorporates both a mask and a photocathode.

If an external electron source is used, the electrons should be relatively monoenergetic. If a photocathode is used, the emitted electrons will have fairly low energies, so controlling their energy range is relatively simple.

Where e-beams are used in the present invention, they may be replaced by ions or other charged particle beams.

For any of the embodiments of this invention (X-ray or e-beam), suitable conditions for exposure (degree of vacuum, appropriate resists, etc.) are known in the art, as are methods for developing and processing the exposed resist.

A "mask" means an object with a portion comprising a pattern relatively permeable to light (including X-rays) or e-beams (as appropriate in context), and with the remainder relatively impermeable to light or e-beams (as appropriate in context).

It will be readily apparent to those skilled in the art that various modifications of the embodiments described are possible without departing from the spirit of the invention. For example, it is possible to move or scan components other than the ones specifically described here as moving, so long as the relative motion of the various components with respect to one another is preserved.

I claim:

1. An electron-beam lithography apparatus, comprising:
    (a) an electron source comprising a mask, a photocathode, or both a mask and a photocathode, for generating a patterned electron beam;
    (b) means for placing a substrate with an electron-sensitive resist layer in a position to receive at least a portion of the patterned electron beam;
    (c) a conductive plate with a slit, said plate being intermediate said electron source and said substrate-placing means, whereby electrons of the patterned electron beam pass through the slit but not through the remainder of the plate;
    (d) means for providing an electric field between said electron source and said conductive plate to accelerate the electrons, wherein the conductive plate causes the electric field between said conductive plate and said substrate-placing means to be substantially zero;
    (e) means for providing a magnetic field between said electron source and said substrate-placing means, to focus the electrons on the substrate; and
    (f) means for synchronously scanning the mask or the photocathode and said substrate-placing means at the same velocity relative to the slit and to said electron source, and at zero velocity relative to each other, whereby substantially all of the pattern of the patterned electron beam is imaged on the substrate without substantial change in size.

2. An apparatus as recited in claim 1, additionally comprising means for correcting for distortions, registration errors, or magnification errors, said correcting means comprising at least one of the following means:
    (a) means for varying the magnetic field; or
    (b) means for adjusting the alignment between the mask or the photocathode and the substrate-placing means during said scanning.

3. A process for 1:1 imaging of a patterned electron beam onto a substrate with an electron-sensitive resist layer, comprising the steps of:
    (a) generating a patterned electron beam from an electron source comprising a mask, a photocathode, or both a mask and a photocathode;
    (b) placing the substrate in a position to receive at least a portion of the patterned electron beam;
    (c) placing a conductive plate with a slit in the path of electrons of the patterned electron beam, before the substrate, whereby electrons pass through the slit but not through the remainder of the plate;
    (d) providing an electric field between the source of electrons and said conductive plate to accelerate the electrons, wherein the conductive plate causes the electric field between said conductive plate and the substrate to be substantially zero;
    (e) providing a magnetic field between the source of electrons and the substrate, to focus the electrons on the substrate; and
    (f) synchronously scanning the mask or the photocathode and the substrate at the same velocity relative to the slit and to said electron source, and at zero velocity relative to each other, whereby substantially all of the patterned electron beam is imaged on the substrate without substantial change in size.

4. A process as recited in claim 3, additionally comprising the step of correcting for distortions, registration errors, or magnification errors, said correcting step comprising at least one of the following steps:
    (a) varying the magnetic field; or
    (b) adjusting the alignment between the mask and the substrate during said scanning.

* * * * *